United States Patent
Xiao

(10) Patent No.: US 9,490,300 B2
(45) Date of Patent: Nov. 8, 2016

(54) COMPLEMENTARY CARBON NANOTUBE NEURON DEVICE

(71) Applicant: SEMICONDUCTOR MANUFACTURING INTERNATIONAL (SHANGHAI) CORPORATION, Shanghai (CN)

(72) Inventor: Deyuan Xiao, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 0 days.

(21) Appl. No.: 14/981,807

(22) Filed: Dec. 28, 2015

(65) Prior Publication Data

US 2016/0190210 A1    Jun. 30, 2016

(30) Foreign Application Priority Data

Dec. 29, 2014 (CN) .......................... 2014 1 0856188

(51) Int. Cl.
| | | |
|---|---|---|
| H01L 27/00 | (2006.01) | |
| H01L 51/00 | (2006.01) | |
| B82Y 10/00 | (2011.01) | |
| H01L 27/28 | (2006.01) | |
| H01L 51/05 | (2006.01) | |
| H01L 51/10 | (2006.01) | |

(52) U.S. Cl.
CPC ......... *H01L 27/283* (2013.01); *H01L 51/0023* (2013.01); *H01L 51/0048* (2013.01); *H01L 51/055* (2013.01); *H01L 51/0558* (2013.01); *H01L 51/105* (2013.01); *B82Y 10/00* (2013.01)

(58) Field of Classification Search
CPC ....... B82Y 10/00; B82Y 40/00; B82Y 15/00; H01L 27/283; H01L 27/3262; H01L 27/2436; H01L 51/0048; H01L 51/0023; H01L 51/055; H01L 51/105; H01L 51/0558
See application file for complete search history.

(56) References Cited

U.S. PATENT DOCUMENTS

| | | | | |
|---|---|---|---|---|
| 8,384,065 | B2 * | 2/2013 | Bangsaruntip | B82Y 10/00 257/24 |
| 9,093,508 | B1 * | 7/2015 | Xiao | H01L 29/0665 |
| 2006/0216897 | A1 * | 9/2006 | Lee | B82Y 10/00 438/282 |
| 2009/0072223 | A1 * | 3/2009 | Awano | B82Y 10/00 257/24 |
| 2011/0133162 | A1 * | 6/2011 | Bangsaruntip | B82Y 10/00 257/24 |
| 2014/0332753 | A1 * | 11/2014 | Xiao | H01L 29/0665 257/12 |

OTHER PUBLICATIONS

Shibata, Tadashi, "A Functional MOS Transistor Featuring Gate-Level Weighted Sum and Threshold Operations", IEEE Transactions on Electron Devices, vol. 39, No. 6, Jun. 1992, 1444-1454.

* cited by examiner

*Primary Examiner* — Nikolay Yushin

(74) *Attorney, Agent, or Firm* — Kilpatrick Townsend & Stockton LLP

(57) ABSTRACT

A method for forming a semiconductor device includes providing a substrate structure, which includes a carbon nanotube supported by two support structures on a substrate. The carbon nanotube includes a first portion and a second portion having different conductivity types. A multi-layer film structure is formed surrounding the carbon nanotube, the multi-layer film structure including a conductive material layer sandwiched between two dielectric layers. A plurality of first electrodes are formed surrounding the multi-layer film structure surrounding a channel region of the first portion, and a plurality of second electrodes are formed surrounding the multi-layer film structure surrounding a channel region of the second portion. A third electrode is formed to contact one end of the carbon nanotube, and a fourth electrode is formed to contact the other end of the carbon nanotube. A fifth electrode is formed and coupled to a center portion of the carbon nanotube.

20 Claims, 9 Drawing Sheets

COMPLEMENTARY CARBON NANOTUBE NEURON DEVICE

CROSS-REFERENCES TO RELATED APPLICATIONS

This application claims priority to Chinese patent application No. 201410856188.X, filed on Dec. 29, 2014, the content of which is incorporated herein by reference in its entirety. This application is also related to concurrently filed U.S. patent application Ser. No. 14/980,531, which claims priority to Chinese patent application No. 201410856215.3, filed on Dec. 29, 2014, and U.S. patent application Ser. No. 14/980,623, which claims priority to Chinese patent application No. 201410840374.X, filed on Dec. 29, 2014.

BACKGROUND OF THE INVENTION

The present invention relates to the field of semiconductor technology. Specifically, embodiments of the invention are directed to nanowire semiconductor device structures and manufacturing methods.

With the development of integrated circuits and the improvements in the degree of integration, there have been many difficulties and unsolved problems with conventional silicon integrated circuits based on single transistor functionality. For example, the ability to further increase the density of components on a chip is limited. Neuron MOS transistors (Neuron Metal-Oxide Semiconductor Field Effect Transistor, abbreviated as neuMOS or vMOS) as powerful single-cell transistors provide an effective way of addressing the increasing number of transistors in integrated circuits and interconnection lines.

A neuron MOS transistor has a floating gate, which is capacitively coupled to the input terminal. The functionalities of a neuron device are similar to those of the nerve cells forming the human brain, the eye, and the like. Specifically, a neuron device provides a weighted sum of a plurality of input signals and outputs a predetermined signal when the resultant weighted sum of input signals reaches a predetermined threshold value. Such a neuron device includes a weighting tool for providing a weighted sum of a plurality of input signals. When the weighted sum of input voltages reaches a predetermined value, the source and the drain of the neuron device become conducting with respect to each other. The weighting tool is equivalent to a synapse between neuron cells. For example, the weighting tool may include resistors and field effect transistors. A neuron transistor is equivalent to the cell body of a neuron cell.

BRIEF SUMMARY OF THE INVENTION

Embodiments of the present invention provide a carbon nanotube neural device structure and manufacturing process.

According to some embodiments of the present invention, a semiconductor device includes a substrate and an insulating layer overlying the substrate. A carbon nanotube is located above the insulating layer. The carbon nanotube includes a first portion and a second portion. The first and second portions, respectively, include a first end region, a channel region, and a second end region. The first end region of the first portion is connected to the first end region of said second portion. The first portion and the second portion have different conductivity types. A multi-layer film structure surrounds the channel region and the first end region of the first portion and the channel region and the first end region of the second portion. The multi-layer film structure includes a first dielectric layer, a conductive material layer, and a second dielectric layer. The multi-layer film structure is partially removed to expose the first end region of the first portion and the first end region of the second portion. A plurality of first electrodes are disposed surrounding the multi-layer film structure at the channel region of the first portion. The plurality of first electrodes are separated from each other. A plurality of second electrodes are disposed surrounding the multi-layer film structure at the channel region of the second portion. The plurality of second electrodes are separated from each other. The device also has a third electrode surrounding the second region of the first portion, and a fourth electrode surrounding the second region of the second portion. The device further has a fifth electrode coupled to the exposed first end region of the first portion and the exposed first end region of the second portion. The fifth electrode is insulated from the conductive material layer in the multi-layer film structure. The carbon nanotube is supported on the substrate by the plurality of first electrodes, the plurality of second electrodes, the third electrode, the fourth electrode, and the fifth electrode.

In an embodiment of the device, the second end region of the first portion is more heavily doped than the first end region and the channel region of the first portion. Further, the second end region of the second portion is more heavily doped than the first end region and the channel region of the second portion.

In an embodiment, a portion of the multi-layer film structure is disposed between the electrodes and the insulating layer overlying the substrate.

In an embodiment, the first dielectric layer and the second dielectric layer in the multi-layer film structure include a high K dielectric. The conductive material layer in the multi-layer film structure includes a polysilicon material or a metal material.

In an embodiment, the carbon nanotube is formed by a reaction of a metal catalyst with a carbon-based compound.

In an embodiment, the metal catalyst includes one or more of platinum, gold, silver, copper, and nickel. The conductive material layer in the multi-layer film structure comprises a polysilicon material or a metal material.

In an embodiment, the conductive material layer thickness is in the range of 2-10 nm; the first dielectric layer thickness is in the range of 1-3 nm; the thickness range of the second dielectric layer is in the range of 1-3 nm; the length of the carbon nanotube is 50-1000 nm; the adjacent first electrodes are spaced from each other by a distance of 10-50 nm; and the adjacent plurality of second electrodes are spaced from each other a distance of 10-50 nm.

According to other embodiments of the invention, a method for forming a semiconductor device includes providing a substrate structure. The substrate structure includes a substrate, an insulating layer overlying the substrate, two support structures overlying the insulating layer, and a carbon nanotube supported by the support structures. The carbon nanotube includes a first portion and a second portion. The first and second portions, respectively, includes a first end region, a channel region, and a second end region. The first end region of the first portion is connected to the first end region of the second portion. The first portion has a first conductivity type, and the second portion has a second conductivity type. The method also includes forming a multi-layer film structure surrounding the carbon nanotube. The multi-layer film structure includes a first dielectric layer, a conductive material layer, and a second dielectric layer. The method also includes forming a plurality of first electrodes surrounding the multi-layer film structure at the channel region of the first portion. The plurality of first electrodes are separated from each other. The method further includes forming a plurality of second electrodes surrounding the multi-layer film structure at the channel region of the second portion. The plurality of second electrodes are separated from each other. The method also includes forming a third electrode surrounding the second region of the first portion, and forming a fourth electrode surrounding the second region of the second portion. The method further includes removing a portion of the multi-layer film structure to expose the first end region of the first portion and the first end region of the second portion, and forming a fifth electrode coupled to the exposed first end region of the first portion and the exposed first end region of the second portion. The fifth electrode is insulated from the conductive material layer in the multi-layer film structure. The carbon nanotube is supported on the substrate by the plurality of first electrodes, the plurality of second electrodes, the third electrode, the fourth electrode, and the fifth electrode support.

In an embodiment of the above method, forming the third and the fourth electrodes includes removing by selective etching the multi-layer film structures at the second end regions of the first portion and the second portion, and the two support structures. An evaporation and lift-off process is used to form the third electrode surrounding the second region of the first portion. The second end region of the first portion is heavily doped with impurities of the first conductivity type. The method also includes using an evaporation and lift-off process to form the fourth electrode surrounding the second region of the second portion, and heavily dope the second end region of the second portion with impurities of the second conductivity type.

In an embodiment, the third electrode and the fourth electrode are formed using different materials.

In an embodiment, forming the fifth electrode includes the following steps.
  using an etch back process to partially remove the multi-layer film structure at the intersection of the first end regions of the first and second portions to expose the first end region of the first portion and the first end region of the second portion;
  oxidizing a surface region of the conductive material layer to form an oxide layer; and
  using an evaporation and lift-off process to form the fifth electrode, the fifth electrode being insulated from the multi-layer film structure by the oxide layer.

In an embodiment, forming a multi-layer film structure surrounding the carbon nanotube includes forming a multi-layer film structure overlying the insulating layer overlying the substrate and the two support structures.

In an embodiment, providing the substrate structure includes the following steps.
  providing a substrate;
  forming an insulating layer overlying the substrate;
  forming a layer of porous silicon on the insulating layer;
  introducing a metal catalyst in a surface region of the porous silicon layer for forming the carbon nanotube;
  causing the metal catalyst to react with a carbon-based compound to form the carbon nanotube on the surface of the porous silicon layer;
  doping the carbon nanotube to form the first portion and the second portion; and
  removing the porous silicon layer under the carbon nanotube to form two support structures with the remaining porous silicon layer.

In an embodiment, the method also includes:
  forming a photoresist layer on the surface of the porous silicon;
  patterning the photoresist to remove the photoresist from the desired area for the carbon nanotube;
  injecting a solution of the metal catalyst into the desired area of the carbon nanotube;
  performing heat treatment of the solution of metal catalyst in an atmosphere of reducing gas to form metal nanoparticles; and
  removing the remaining photoresist on the surface of the porous silicon.

In an embodiment, forming a layer of porous silicon on the insulating layer includes forming heavily doped polysilicon on the insulating layer and using corrosion or etching to form the porous silicon.

In an embodiment, the carbon-based compound includes one or more of methane, ethylene, acetylene, carbon monoxide, and benzene.

In an embodiment, the metal catalyst includes one or more of platinum, gold, silver, copper, and nickel.

In an embodiment, the first dielectric layer and the second dielectric layer in the multi-layer film structure includes a high K dielectric.

In an embodiment, the conductive material layer in the multi-layer film structure includes a polysilicon material or a metal material.

In an embodiment, the conductive material layer thickness is in the range of 2-10 nm; the first dielectric layer thickness is in the range of 1-3 nm; the thickness range of the second dielectric layer is in the range of 1-3 nm; the length of the carbon nanotube is 50-1000 nm; adjacent first electrodes are spaced from each other by a distance of 10-50 nm; and adjacent plurality of second electrodes are spaced from each other a distance of 10-50 nm.

A further understanding of the nature and advantages of the present invention may be realized by reference to the remaining portions of the specification and the drawings.

DETAILED DESCRIPTION OF THE INVENTION

Figure 1:
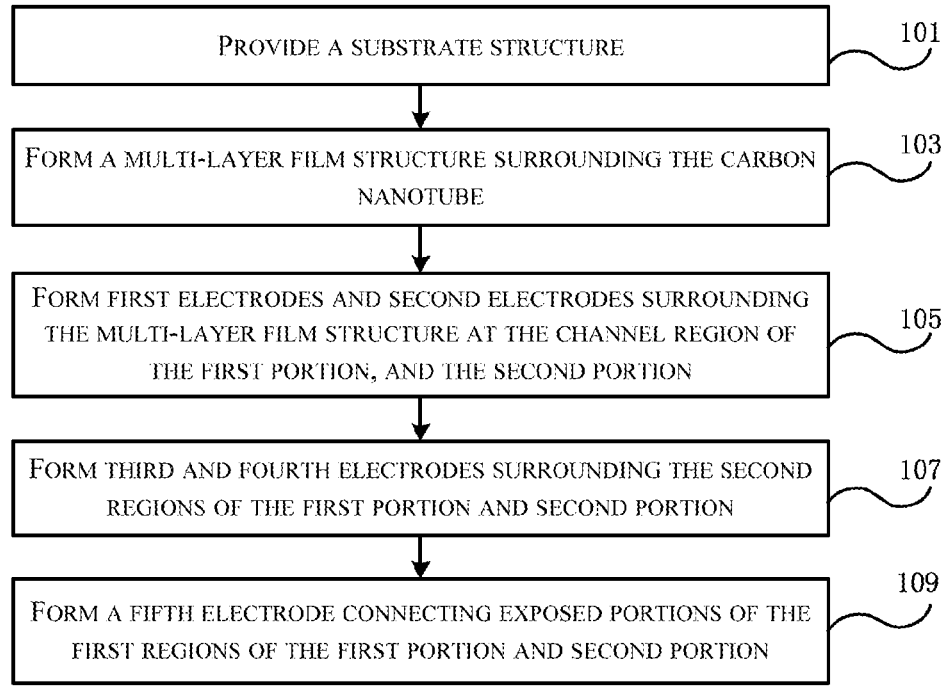
FIG. 1 is a simplified flowchart illustrating a method for forming a semiconductor device according to an embodiment of the present invention.

Exemplary embodiments of the present invention will be described with reference to the figures. The following description of exemplary embodiments is illustrative only, and not intended to be any limitation on the invention and its application or use. It is understood that the relative arrangement of parts and steps and numeric expressions set forth in these embodiments are not to be construed as limiting the scope of the invention. It is also understood that, for convenience of description, the size of the various components shown in the drawings are not necessarily drawn in actual proportional relationship. Techniques, methods and devices known to one of ordinary skill in the relevant art may not be discussed in detail, but in situations in which these techniques, methods and apparatus apply, these techniques, methods and apparatus should be considered as part of this specification. Further, similar reference numerals and letters are used to refer to similar items in the following figures, and once an item is defined in one of the figures, it will not need to be explained further in the subsequent figures.

Embodiments of the present invention provide a semiconductor device and a manufacturing method, in which the semiconductor device can be used as a complementary-type carbon nanotube neural component, which includes an n-type carbon nanotube neural component (hereinafter referred to as n-type vMOS) and a p-type carbon nanotube neural component (hereinafter referred to as p-type vMOS). The n-type vMOS and p-type vMOS each has a plurality of input electrodes, and both share a floating gate and an output electrode.

FIG. 1 is a simplified flowchart illustrating a method for forming a semiconductor device according to an embodiment of the present invention. As shown in FIG. 1, the method for forming a semiconductor device includes the following steps.

At step 101, the method for forming a semiconductor device includes providing a substrate structure. The substrate structure includes a substrate, an insulating layer overlying the substrate, two support structures overlying the insulating layer, and a carbon nanotube supported by the support structures. The carbon nanotube includes a first portion and a second portion. The first and second portions, respectively, include a first end region, a channel region, and a second end region. The first end region of the first portion is connected to the first end region of the second portion. The first portion has a first conductivity type, and the second portion has a second conductivity types. In some embodiments, the first conductivity type is different from the second conductivity type. For example, the first conductivity type can be n-type, and the second conductivity type can be p-type. In some embodiments, the substrate can be a silicon substrate, but can also be other types of substrate. The insulating layer can be a silicon oxide. The support structure can be a semiconductor or dielectric structure that can support the carbon nanotube.

At step 103, the method also includes forming a multi-layer film structure surrounding the carbon nanotube. The multi-layer film structure includes a first dielectric layer, a conductive material layer, and a second dielectric layer. The conductive structure can be used as a floating gate in the finished device.

At step 105, the method also includes forming a plurality of first electrodes surrounding the multi-layer film structure at the channel region of the first portion. The plurality of first electrodes are separated from each other. The method further includes forming a plurality of second electrodes surrounding the multi-layer film structure at the channel region of the second portion. The plurality of second electrodes are separated from each other. The first and second electrodes can be used as input electrodes in the device.

At step 107, the method also includes forming a third electrode surrounding the second region of the first portion, and forming a fourth electrode surrounding the second region of the second portion. The third and fourth electrodes can be the source/drain of the n-type vMOS and p-type vMOS.

At step 109, the method further includes removing a portion of the multi-layer film structure to expose the first end region of the first portion and the first end region of the second portion, and forming a fifth electrode coupled to the exposed first end region of the first portion and the exposed first end region of the second portion. The fifth electrode is insulated from the conductive material layer in the multi-layer film structure. The fifth electrode can be a common output electrode for the n-type vMOS and p-type vMOS. The carbon nanotube is supported on the substrate by the plurality of first electrodes, the plurality of second electrodes, the third electrode, the fourth electrode, and the fifth electrode support.

FIGS. 2-11B are view diagrams that illustrate the method of forming a semiconductor device according to an embodiment of the invention.

Figure 2:
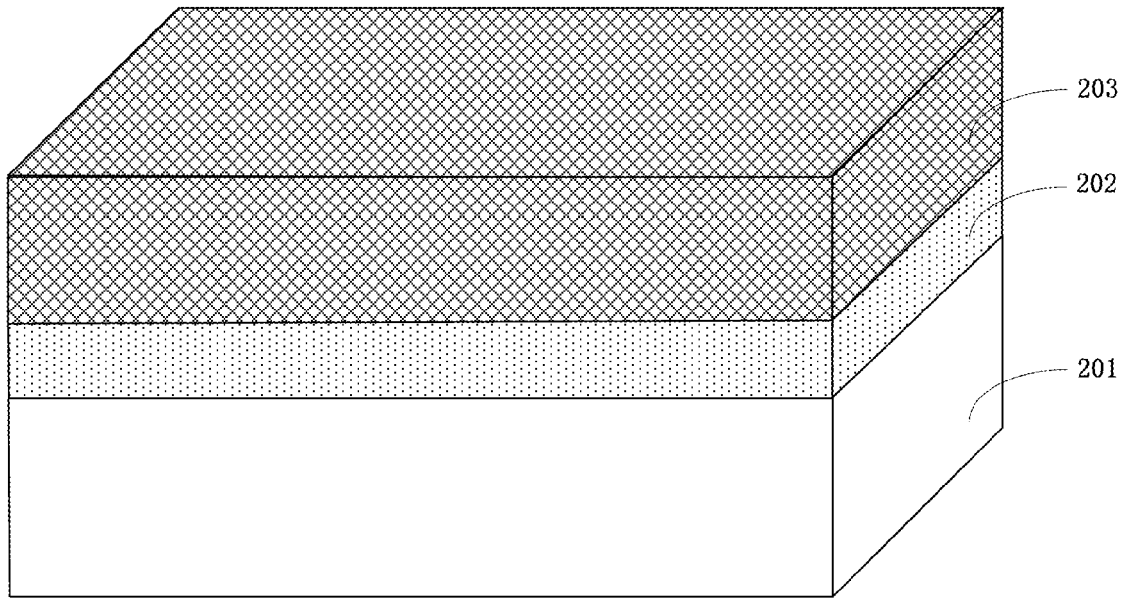
FIG. 2 is a perspective view illustrating a stage of the method for manufacturing a semiconductor device according to an embodiment of the present invention.

FIGS. 2-4, 5A, 5B, 6A, and 6B are view diagrams that illustrate the method for forming the substrate structure. As shown in FIG. 2, a substrate 201 is provided. The substrate can be a silicon substrate, but is not so limited. An insulating layer 202 is formed overlying the substrate. For example, an oxidation step can be used to form an oxide layer as the insulating layer. A layer of porous silicon 203 is formed on the insulating layer. The thickness of insulating layer 202 may range from 10 to 100 nm, e.g., 10 nm, 30 nm, 60 nm, 100 nm, etc. Thickness in the range of porous silicon 203 may be 2-10 nm, e.g. 2 nm, 5 nm, 8 nm, or 10 nm, etc.

In an embodiment, forming the porous silicon on the insulating layer includes depositing heavily doped polysilicon on insulating layer 202, followed by a variety of methods to convert polysilicon into porous silicon, as described below. In an example, an electrochemical corrosion method (anodic etching) can be used to form the porous silicon. Specifically, the silicon substrate with the depositing polysilicon can be inserted in an etching solution in an electrolysis cell. The silicon substrate divides the cell into two independent cells, with two electrode plates facing each face on both sides of the wafer as a cathode and an anode. After applying a voltage to the electrodes, under the influence of an electric field, the current flows through the silicon substrate from a "half-cell" to another "half-cell." The holes in the silicon substrate flow to the substrate surface facing the cathode, causing electrochemical corrosion of the silicon substrate at the cathode side. The silicon surface facing the anode remains almost unchanged. By changing the magnitude of the corrosion current different pore sizes can be obtained. By changing the etching time different thicknesses of porous silicon can be obtained.

As another example, a photochemical process can be used to form porous silicon. In this method, under a light, the silicon wafer is immersed in hydrofluoric acid (HF) aqueous solution or ethanol ($C_2H_5OH$) solution to react with HF. The light produces non-equilibrium carriers in silicon, providing electrons and holes to speed up the reaction at the surface. Further, an ethanol solution of hydrofluoric acid may be used, for example, a volume ratio of 1:1 of (HF) V ($C_2H_5OH$) ethanol solution (volume ratio) of hydrofluoric acid. The etching time may be 180 minutes. For example, the emission wavelength of 632.8 nm of He—Ne laser light at a power of 1.5 mW can be used on n-type silicon wafers. In addition, a lens can be used to expand the radius of the light irradiation.

In an embodiment, an etching method can be used to form the porous silicon. For example, an HF solution can be sprayed through a nozzle on the surface of the silicon wafer to form porous silicon.

As another example, the porous silicon layer can be formed by a hydrothermal etching method. The hydrothermal etching method includes the steps of: cleaning the wafer, soaking the single crystalline silicon wafer in acetone or ethanol for 15 minutes to remove organic contaminants attached to the surface, and then repeatedly rinsing with distilled water. Then the wafer is fixed to the inner core of a high-pressure water autoclave; then an etching solution (HF acid, HF+$HNO_3$ solution, etc.) is injected, followed by a heat treatment at 100 to 250° C. for 1 to 3 hours. After cooled down to room temperature, the sample is removed from the water autoclave, soaked in distilled water, washed, and then dried naturally in air at room temperature.

Figure 3:
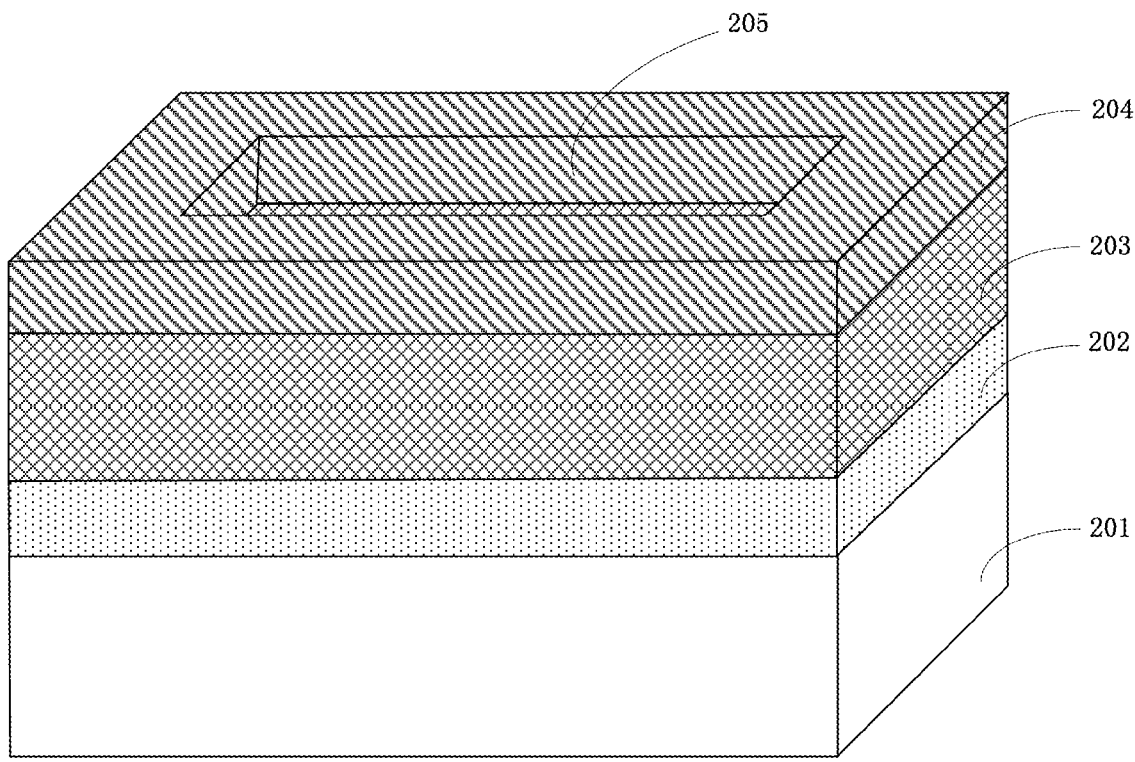
FIG. 3 is a perspective view illustrating a stage of the method for manufacturing a semiconductor device according to an embodiment of the present invention.

As shown in FIG. 3, a metal catalyst is introduced in a region 205 for a carbon nanotube on the surface of porous silicon 203. Here, a photoresist layer 204 is formed on the surface of porous silicon 203. The photoresist is then patterned to remove the photoresist from the desired area 205 for the carbon nanotube. Even though region 205 is shown to be rectangular in FIG. 3, it is understood that region 205 can have other shapes, e.g., an elliptical shape. Next, a solution of the metal catalyst is injected into the desired area of the carbon nanotube. The metal catalyst can include one or more of platinum, gold, silver, copper, and nickel, etc.

Figure 4:
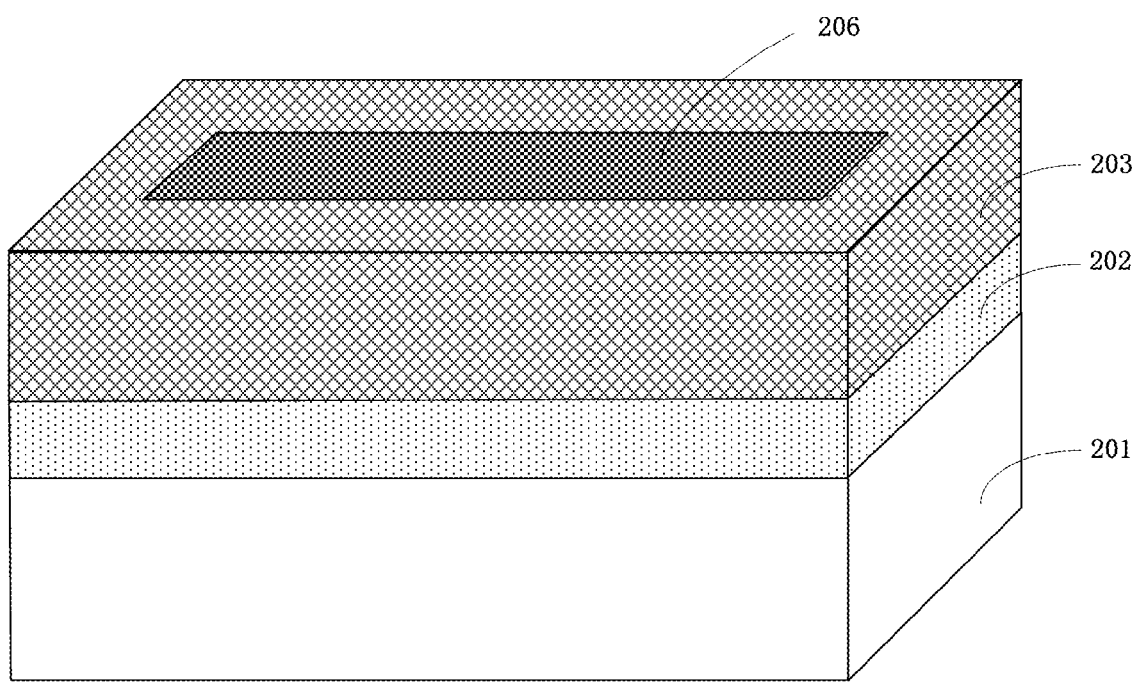
FIG. 4 is a perspective view illustrating a stage of the method for manufacturing a semiconductor device according to an embodiment of the present invention.

In FIG. 4, a heat treatment of the solution of metal catalyst is performed in an atmosphere of reducing gas to form metal nanoparticles 206. In an embodiment, the diameter of the metal nanoparticles can be 3 nm or less. The metal nanoparticles can be used as catalyst in forming the carbon nanotube. After the carbon nanotube are formed, the remaining photoresist on the surface of the porous silicon can be removed.

Figure 5A:
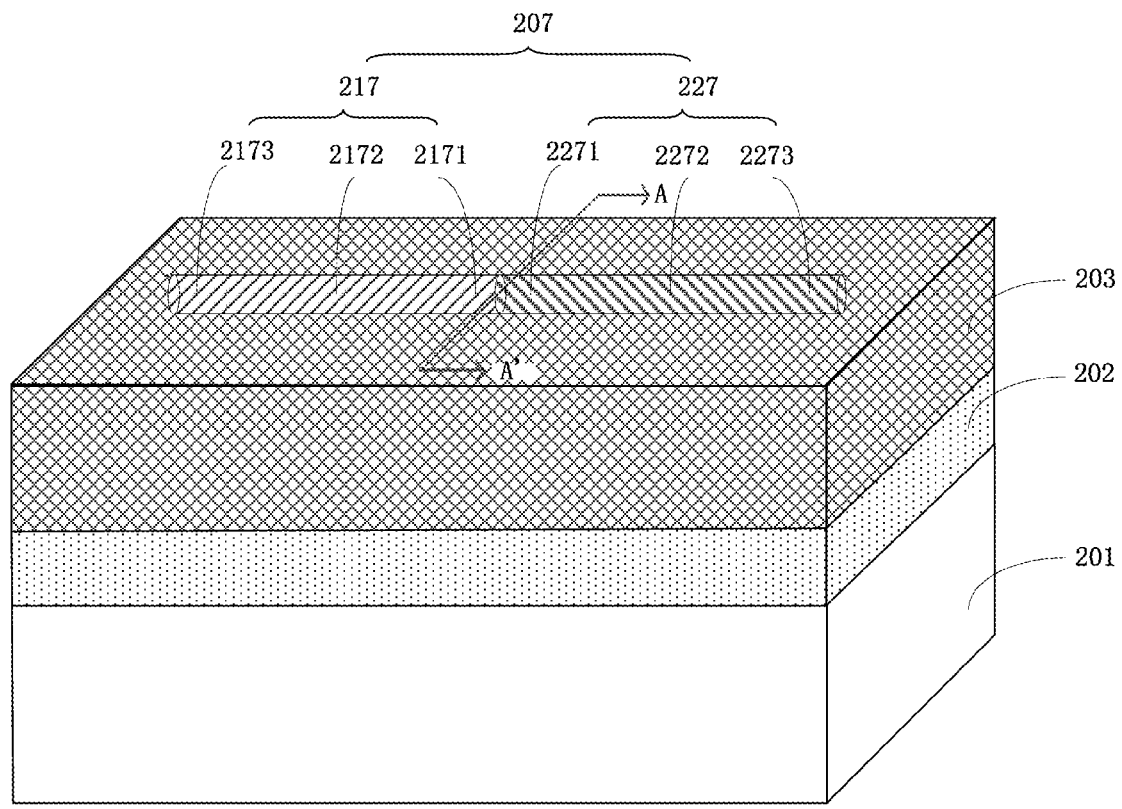
FIG. 5A is a perspective view illustrating a stage of the method for manufacturing a semiconductor device according to an embodiment of the present invention.
Figure 5B:
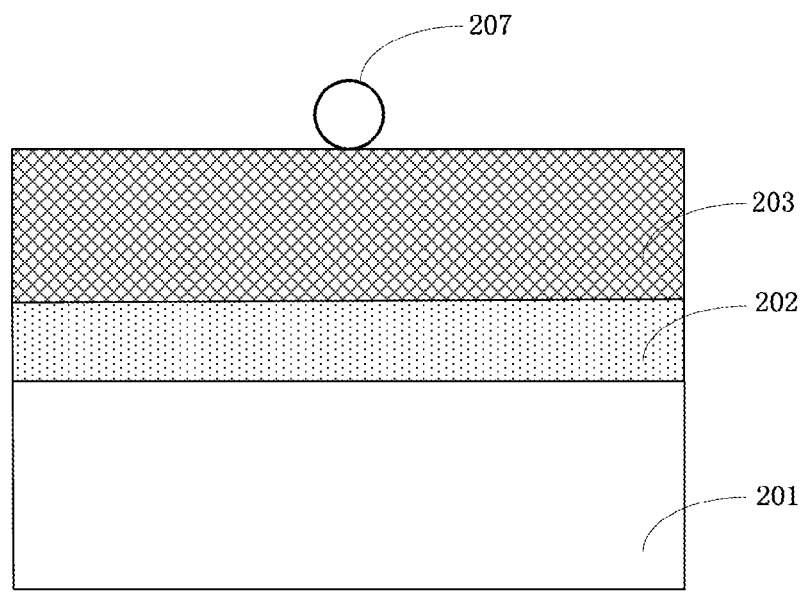
FIG. 5B is a cross-sectional view illustrating the stage of the method for manufacturing a semiconductor device of FIG. 5A along the A-A' direction.

In FIG. 5A, the metal catalyst is reacted with a carbon-based compound, and a carbon nanotube 207 is formed on the porous silicon layer 203. FIG. 5B is a cross-sectional view illustrating the stage of the method for manufacturing a semiconductor device of FIG. 5A along the A-A' direction. Similarly, FIGS. 6B, 7B, . . . , 11B are cross-sectional views of FIGS. 6, 7, . . . , 11 along the AA' direction.

In FIGS. 5A and 5B, a carbon nanotube 207 may be formed on the surface of the porous silicon layer 203, through reactions of the metal catalyst with a carbon-based compound. Various methods may be used to cause the chemical reaction of the metal catalyst with a carbon-based compound to form a carbon nanotube 207. For example, chemical vapor deposition (CVD) may be used, for example at a temperature of 800 to 1000° C. to cause a reaction with the carbon-based compound in the CVD chamber to form carbon nanotube 207. The carbon-based compound may include at least one of methane, ethylene, acetylene, carbon monoxide and benzene. Those skilled in the art should appreciate that the above-mentioned chemical vapor deposition method is only exemplary; other ways may also be employed to cause a chemical reaction of the metal catalyst with a carbon-based compound to form a carbon nanotube 207. Further, those skilled in the art can appreciate that other types of carbon-based compounds may also be used, as long as it can react with the metal catalyst to form a carbon nanotube.

For example, the carbon nanotube may be a single-walled carbon nanotube. Metal particles with a diameter less than 3 nanometers (examples include copper, gold, silver and other precious metals and iron group elements, etc.) can produce single-walled carbon nanotube.

In an embodiment of the present invention, the carbon nanotube has a diameter of 1 to 3 nm, e.g. 1.5 nm, 2 nm, or 2.5 nm. The length of the carbon nanotube may be 50 to 500 nm, such as 100 nm, 200 nm, 300 nm, 400 nm, or 500 nm.

In FIG. 5A, carbon nanotube 207 is doped with dopants of different conductivity types to separate the carbon nanotube into two parts, a first portion 217 and a second portion 227. In some embodiments, the first portion 217 can be an n-type carbon nanotube and the second portion 227 can be a p-type carbon nanotube. In other embodiments, the n-type portion and the p-type portion can be reversed. In FIG. 5A, the first portion 217 includes a first end region 2171, a center or channel region 2172, and a second end region 2173. The second portion 227 includes a first end region 2271, a center or channel region 2272, and a second end region 2273. Here, the first end regions and the second end regions are relative end regions of the two portions, and are not necessarily separated from the center or channel regions by a concrete boundary. Further, the first end regions and the second end regions do not have to have the same length.

Figure 6A:
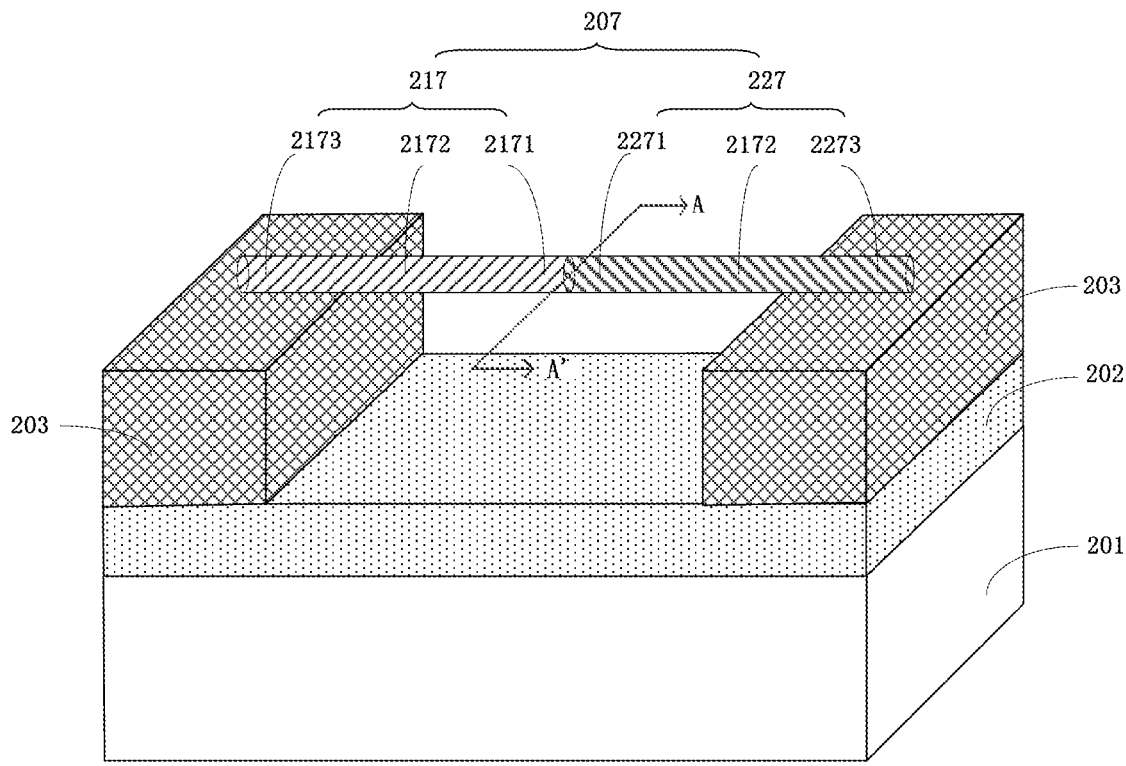
FIG. 6A is a perspective view illustrating a stage of the method for manufacturing a semiconductor device according to an embodiment of the present invention.
Figure 6B:
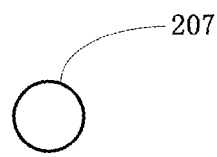
FIG. 6B is a cross-sectional view illustrating the stage of the method for manufacturing a semiconductor device of FIG. 6A along the A-A' direction.
Figure 6B:
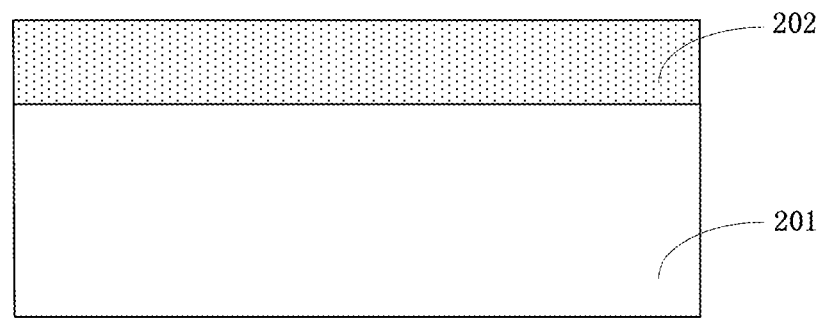

In FIGS. 6A and 6B, a portion of porous silicon 203 under carbon nanotube 207 is removed. Portions of porous silicon 203 under the two end regions of carbon nanotube 207 remain as support structures. Thus, FIGS. 6A and 6B illustrate the substrate structure formed in step 101 of the method of FIG. 1.

Figure 7A:
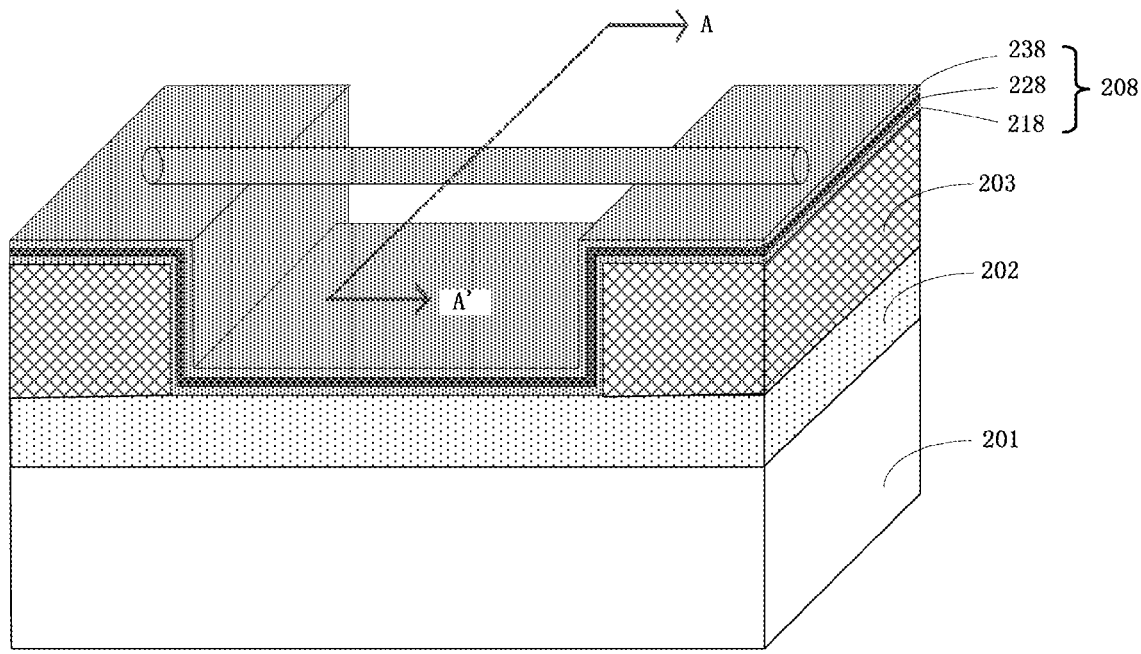
FIG. 7A is a perspective view illustrating a stage of the method for manufacturing a semiconductor device according to an embodiment of the present invention.
Figure 7B:
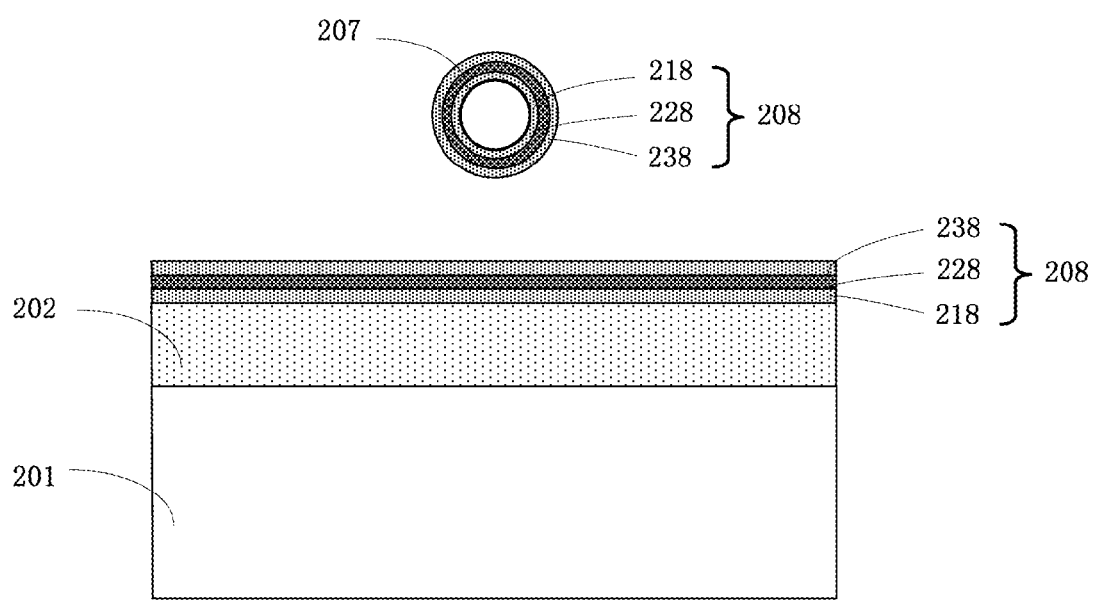
FIG. 7B is a cross-sectional view illustrating the stage of the method for manufacturing a semiconductor device of FIG. 7A along the A-A' direction.

In FIGS. 7A and 7B, a multi-layer film structure 208 is formed surrounding carbon nanotube 207. Multi-layer film structure 208 includes a first dielectric layer 218, a conductive material layer 228, and a second dielectric layer 238.

In an embodiment, multi-layer film structure 208 can be formed using the following processes. First dielectric layer 218 can be formed using an atomic layer deposition (ALD) process, conductive material layer 228 can be formed using a low pressure chemical vapor deposition (LPCVD) process, and second dielectric layer 228 can be formed using an atomic layer deposition (ALD) process. The dielectric and conductive materials can be any suitable dielectric and conductive materials. For example, the conductive material layer can be a polysilicon material or a metal material, e.g., aluminum, tungsten, etc. The first and second dielectric materials can be a high-K dielectric. In some embodiments, the thickness of the conductive material can range from 1-10 nm, e. g., 2 nm, 5 nm, 8 nm, or 10 nm. The thickness of the first and second dielectric layers can range from 1-3 nm, e.g., 2 nm. As shown in FIGS. 7A and 7B, multi-layer film structure 208 is also formed above insulator layer 202 and support structures 203.

Figure 8A:
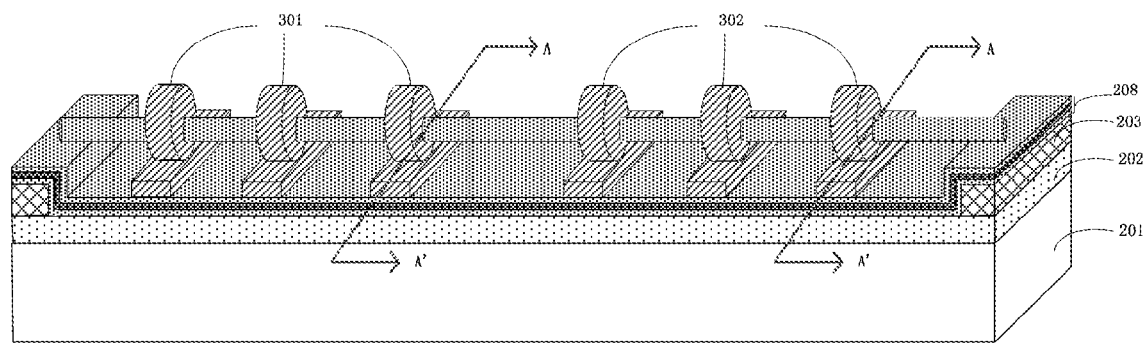
FIG. 8A is a perspective view illustrating a stage of the method for manufacturing a semiconductor device according to an embodiment of the present invention.
Figure 8B:
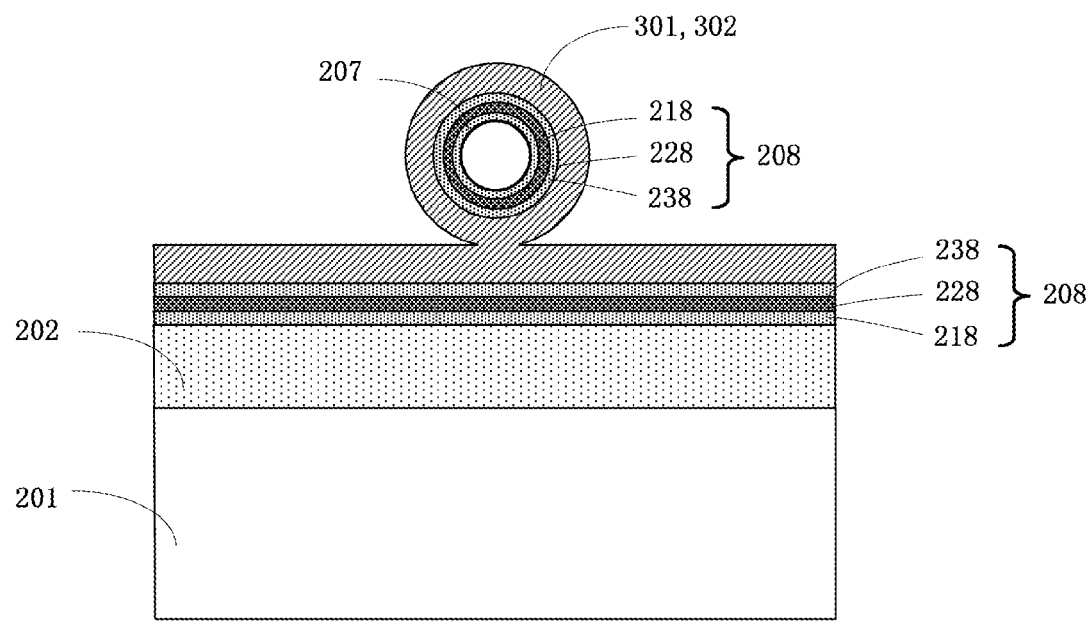
FIG. 8B is a cross-sectional view illustrating the stage of the method for manufacturing a semiconductor device of FIG. 8A along the A-A' direction.

In FIGS. 8A and 8B, a plurality of first electrodes 301 is formed surrounding the multi-layer film structure at the channel region of the first portion. The plurality of first electrodes are separated from each other by a distance of about 10-50 nm, e.g., 10 nm, 20 nm, 40 nm, or 50 nm. Further, a plurality of second electrodes 302 is formed surrounding the multi-layer film structure at the channel region of the second portion. The plurality of second electrodes are separated from each other by a distance of about 10-50 nm, e.g., 10 nm, 20 nm, 40 nm, or 50 nm. The first and second electrodes can be formed by first depositing an electrode material, and then using photolithography and etching to form first and second electrodes. The first and second electrodes can be used as input electrodes in the device.

Figure 9A:
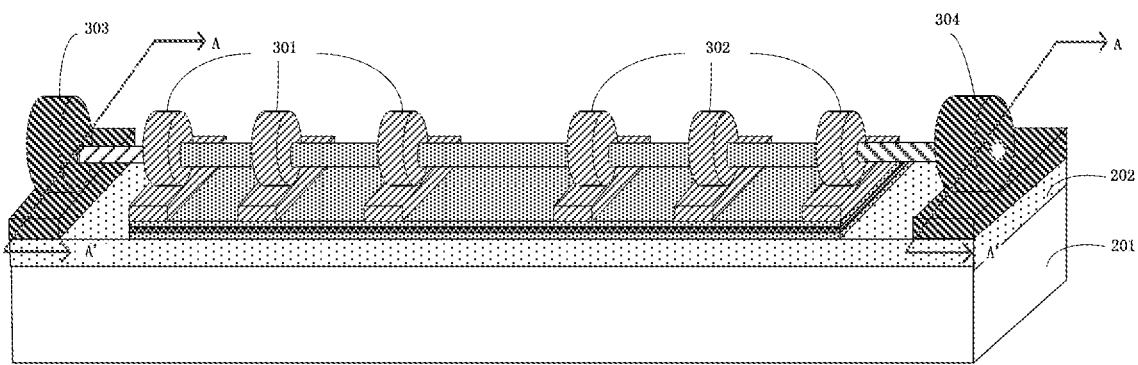
FIG. 9A is a perspective view illustrating a stage of the method for manufacturing a semiconductor device according to an embodiment of the present invention.
Figure 9B:
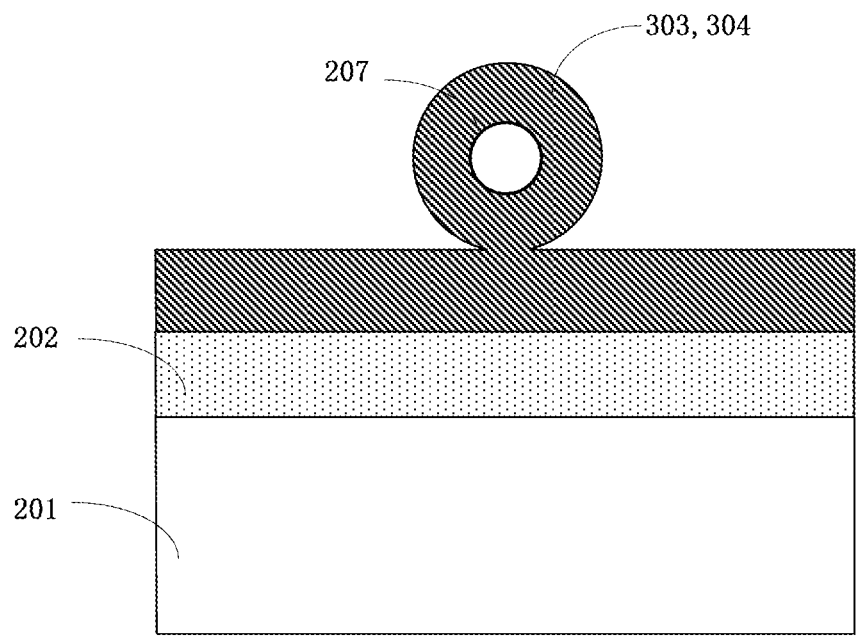
FIG. 9B is a cross-sectional view illustrating the stage of the method for manufacturing a semiconductor device of FIG. 9A along the A-A' direction.

In FIGS. 9A and 9B, a third electrode 303 is formed surrounding the second end region of the first portion, and a fourth electrode 304 is formed surrounding the second end region of the second portion. The third and fourth electrodes can be the source/drain of the n-type vMOS and p-type vMOS. In an embodiment, a selective etch process can be used to remove the multi-layer film structure on the second end region of the first portion and on the second end region of the second portion, and the two support structures. The second end region of the first portion is heavily doped with dopants of the first conductivity type, e. g., n+ type, and an evaporation and lift-off process can be used to form the third electrode 303 surrounding the second end region of the first portion. The second end region of the second portion is heavily doped with dopants of the second conductivity type, e.g., p+ type, and an evaporation and lift-off process can be used to form the fourth electrode 304 surrounding the second end region of the second portion. In some embodiments, the multi-layer film structure can be removed from insulating layer 202.

In some embodiments, the materials for the third and fourth electrodes can be different. For example, the material of the third electrode may include, but is not limited to: Ca (calcium), Sc (scandium), Y (yttrium), and the like. The material for the fourth electrode may include, but is not limited to: Pb (lead), Au (gold), or the like. The third and fourth electrodes contact the heavily doped second end regions of the first and second portions of the nanotube.

Figure 10A:
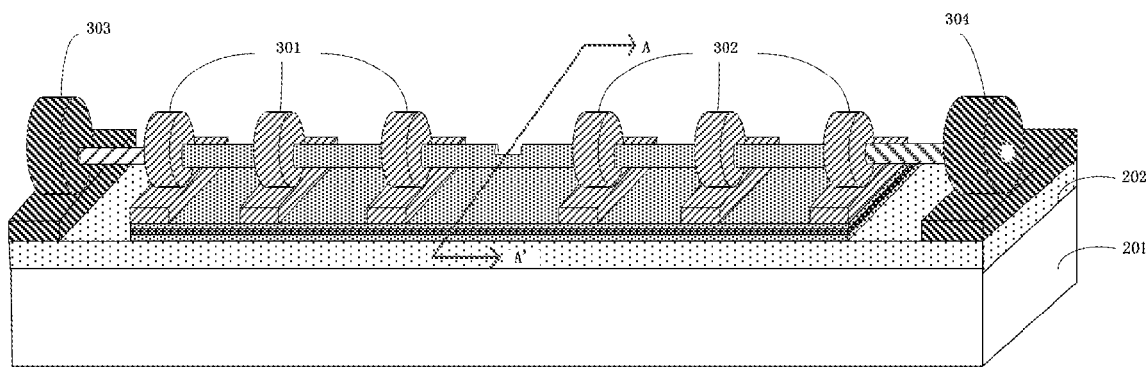
FIG. 10A is a perspective view illustrating a stage of the method for manufacturing a semiconductor device according to an embodiment of the present invention.
Figure 10B:
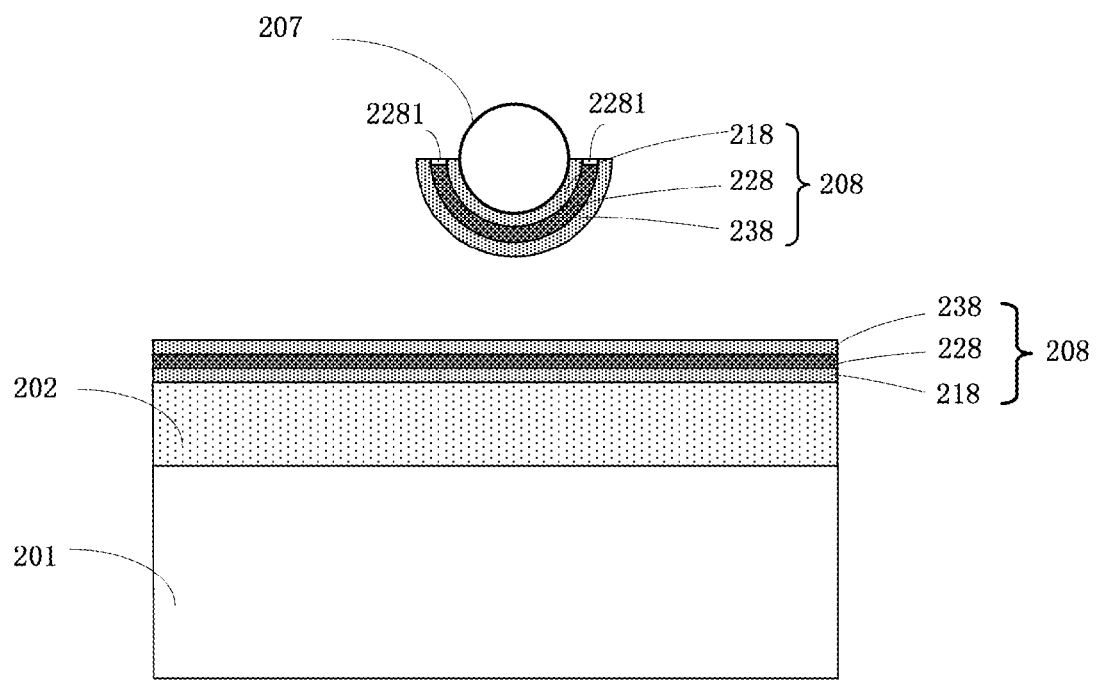
FIG. 10B is a cross-sectional view illustrating the stage of the method for manufacturing a semiconductor device of FIG. 10A along the A-A' direction.

In FIGS. 10A, 10B, 11A, and 11B, the fifth electrode is formed. First, in FIGS. 10A and 10B a portion of the multi-layer film structure is removed to expose the first end region of the first portion and the first end region of the second portion. In one example, as shown in FIG. 10B, an upper portion of the multi-layer film structure is removed to expose the first end region of the first portion and the first end region of the second portion. In other embodiments, other parts of the end regions can be removed to allow the fifth electrode to connect the carbon nanotube. However, in order to insulate the conductive material layer 228 in the multi-layer film structure, an oxidation process can be carried out to form an oxide layer 2281 on the exposed part of the conductive material layer 228 in the multi-layer film structure.

Figure 11A:
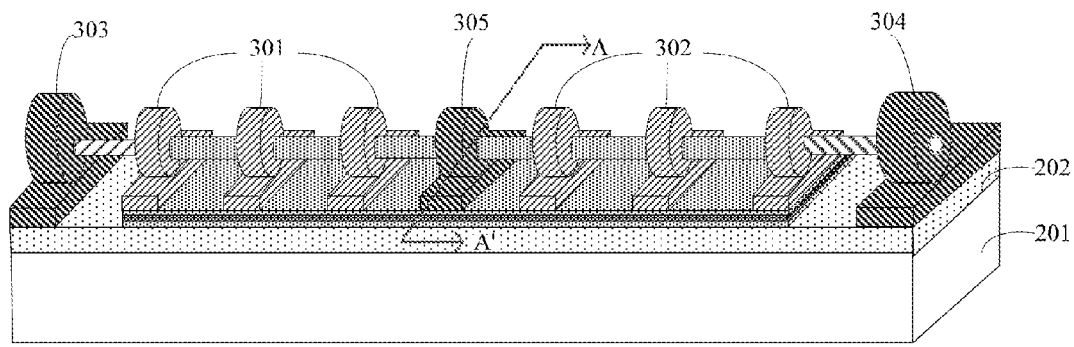
FIG. 11A is a perspective view illustrating a semiconductor device according to an embodiment of the present invention.
Figure 11B:
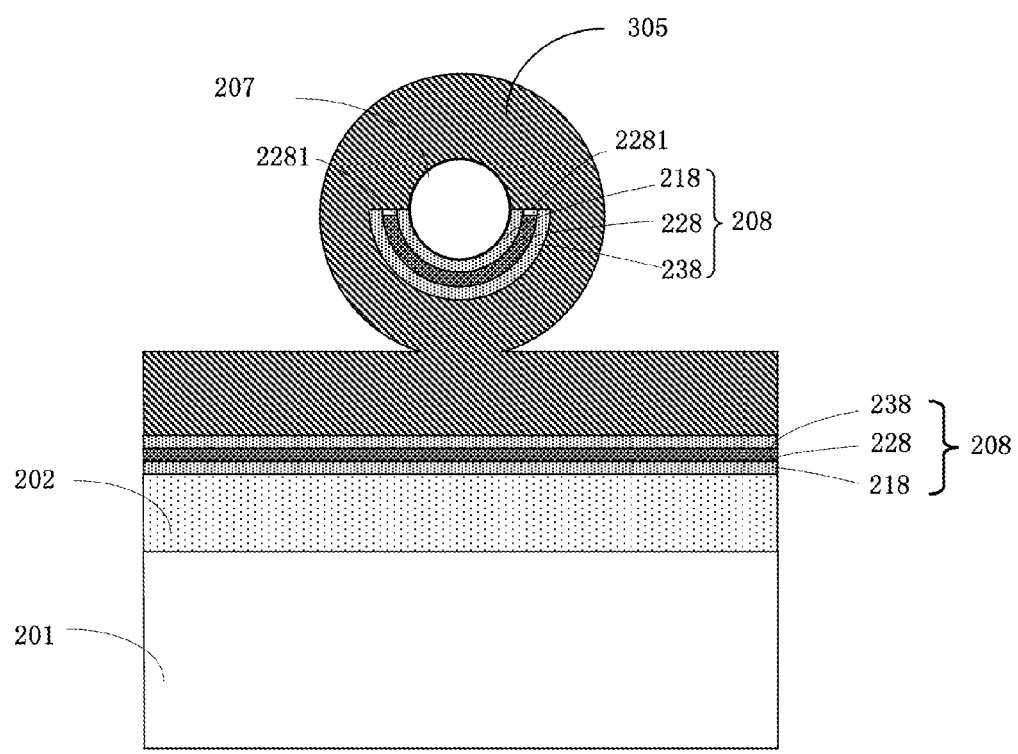
FIG. 11B is a cross-sectional view illustrating the semiconductor device of FIG. 11A.
Figure 11C:
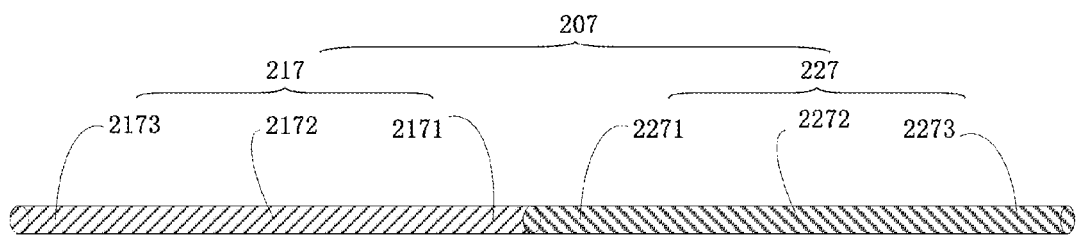
FIG. 11C is a schematic view illustrating the semiconductor device of FIG. 11A

In FIGS. 11A and 11B, an evaporation and lift-off process can be used to form a fifth electrode 305 surrounding the first end regions of the first portion and the second portion. The fifth electrode 305 is coupled to the exposed first end region of the first portion and the exposed first end region of the second portion. The fifth electrode is insulated from the conductive material layer in the multi-layer film structure. The fifth electrode can be a common output electrode for the n-type vMOS and p-type vMOS. The carbon nanotube is supported on the substrate by the plurality of first electrodes, the plurality of second electrodes, the third electrode, the fourth electrode, and the fifth electrode support.

Embodiments of the invention provide a method of manufacturing a semiconductor device including the formation of a full-surround channel region of complementary carbon nanotube neural components. The method can enhance the floating gate to the control of the channel to avoid short channel effect. The manufacturing process of the device is more optimized, and the resulting device structure is also simpler.

FIG. 11A is a perspective view illustrating a semiconductor device according to an embodiment of the present invention. FIG. 11B is a cross-sectional view illustrating the semiconductor device of FIG. 11A along the A-A' direction. FIG. 11B is a schematic view illustrating the semiconductor device of FIG. 11A.

As shown in FIGS. 11A and 11B, according to some embodiments of the present invention, a semiconductor device includes a substrate 201 and an insulating layer 202 overlying the substrate. A carbon nanotube 207 is located above the insulating layer. The carbon nanotube includes a first portion 217 and a second portion 227. The first and second portions, respectively, includes a first end region, a channel region, and a second end region. The first end region 2171 of the first portion is connected to the first end region 2271 of the second portion. The first portion and the second portion have different conductivity types. A multi-layer film structure 208 surrounds the channel region 2172 and the first end region 2171 of the first portion 217 and the channel region 2272 and the first end region 2271 of the second portion. The multi-layer film structure 208 includes a first dielectric layer 218, a conductive material layer 228, and a second dielectric layer 238. The multi-layer film structure is partially removed to expose the first end region of the first portion and the first end region of the second portion.

A plurality of first electrodes 301 are disposed surrounding the multi-layer film structure at the channel region of the first portion. The plurality of first electrodes are separated from each other. A plurality of second electrodes 302 are disposed surrounding the multi-layer film structure at the channel region of the second portion. The plurality of second electrodes are separated from each other. The device also has a third electrode 303 surrounding the second region of the first portion, and a fourth electrode 304 surrounding the second region of the second portion. The device further has a fifth electrode 305 coupled to the exposed first end region of the first portion and the exposed first end region of the second portion. The fifth electrode is insulated from the conductive material layer in the multi-layer film structure. The carbon nanotube is supported on the substrate by the plurality of first electrodes, the plurality of second electrodes, the third electrode, the fourth electrode, and the fifth electrode.

In an embodiment, the first portion of the carbon nanotube has a conductive type of n-type and the second portion p-type, and the semiconductor device can be used as a complementary neuron carbon nanotube device. The device has an n-type vMOS and a p-type vMOS. The n-type vMOS has a plurality of input electrodes (the third electrodes), p-type vMOS has a plurality of input electrodes (the fourth electrodes), and both share a common floating gate (conductive material layer) and an output electrode (the five electrode). It works as follows: the third electrode 203 is grounded, the fourth electrode 204 is coupled to a positive power supply, each of the first electrodes 301 and the second electrodes 302 is an input signal input electrode, and the fifth electrode is an output electrode for providing an output signal. When a plurality of the first electrodes 301 and the second electrodes 302 receive input signals, the signals are weighted to obtain the potential $\Phi_F$ of the conductive material layer 228 as a floating gate. Potential $\Phi_F$ is applied to channel regions 2172 and 2272 in the first and second portions of the carbon nanotube. When $\Phi_F$ is positive and reaches a certain preset value, such that the potential barrier between the channel region 2172 and the first end region 2171 of the first portion 217 is reduced, electrons can flow from the second end of the first portion through the channel region into the first end region; namely, the n-type vMOS is in conduction, and the output at the fifth electrode is 1. When $\Phi_F$ is negative and reaches a certain preset value, such that the potential barrier between the channel region and the first end region of the second portion 227 is reduced, holes can flow from the second end of the second portion through the channel region into the first end region, namely, the p-type vMOS is in conduction, and the output at the fifth electrode is 0.

In an embodiment of the device, the second end region of the first portion is more heavily doped than the first end region and the channel region of the first portion. Further, the second end region of the second portion is more heavily doped than the first end region and the channel region of the second portion.

In an embodiment, a portion of the multi-layer film structure is disposed between the electrodes and the insulating layer overlying the substrate.

In an embodiment, the first dielectric layer and the second dielectric layer in the multi-layer film structure include a high K dielectric. The conductive material layer in the multi-layer film structure includes a polysilicon material or a metal material.

In an embodiment, the carbon nanotube is formed from a reaction of a metal catalyst with a carbon-based compound.

In an embodiment, the metal catalyst includes one or more of platinum, gold, silver, copper, and nickel. The conductive material layer in the multi-layer film structure comprises a polysilicon material or a metal material.

In an embodiment, the conductive material layer thickness is in the range of 2-10 nm; the first dielectric layer thickness is in the range of 1-3 nm; the thickness range of the second dielectric layer is in the range of 1-3 nm; the length of the carbon nanotube is 50-1000 nm; adjacent first electrodes are spaced from each other by a distance of 10-50 nm; and adjacent plurality of second electrodes are spaced from each other a distance of 10-50 nm.

In an embodiment of the present invention, the method of using a chemical reaction of the metal catalyst with a carbon-based compound to form a carbon nanotube on the porous silicon layer further includes: adding ammonia to perform n-type doping on the carbon nanotube being formed, or adding borane to perform p-type doping on the carbon nanotube being formed, thereby forming an n-type or a p-type carbon nanotube. In another embodiment, an n-type or a p-type carbon nanotube may be formed by directly doping an already formed carbon nanotube.

Thus, a manufacturing method of the semiconductor device has been described in detail and according to an embodiment of the present disclosure. In order to maintain clarity of the disclosed concept, certain details known in the art are not described in detail. Those skilled in the art can understand how to implement technical solutions disclosed herein based on the above description.

Unless otherwise indicated, terms such as "first" and "second" are used to distinguish the elements described. Thus, these terms are not necessarily intended to represent the time of these elements or other order. In addition, terms such as "front," "after," "top," "bottom," "upper," and "lower" are used to describe the position in the illustrations and are not intended for describing permanent relative positions permanently.

Although certain embodiments of the present invention are described in detail, those skilled in the art will appreciate that the above examples are for illustration only and not to limit the scope of the invention. Thus, those skilled in the art would appreciate that, aside from embodiments of the present disclosure, various modifications and changes can be made without departing from the spirit and scope of the present disclosure.

What is claimed is:

1. A method for forming a semiconductor device, comprising:
    providing a substrate structure, the substrate structure including:
        a substrate;
        an insulating layer overlying the substrate;
        two support structures overlying the insulating layer;
        a carbon nanotube supported by the support structures, the carbon nanotube including a first portion and a second portion, the first and second portions, respectively, including first end region, a channel region, and a second end region; wherein the first end region of the first portion is connected to the first end region of said second portion, the first portion having a first conductivity type and the second portion having a second conductivity type;
    forming a multi-layer film structure surrounding the carbon nanotube, the multi-layer film structure including a first dielectric layer, a conductive material layer, and a second dielectric layer;
    forming a plurality of first electrodes surrounding the multi-layer film structure at the channel region of the first portion, the plurality of first electrodes being separated from each other;
    forming a plurality of second electrodes surrounding the multi-layer film structure at the channel region of the second portion, the plurality of second electrodes being separated from each other;
    forming a third electrode surrounding the second end region of the first portion;

forming a fourth electrode surrounding the second end region of the second portion;

removing a portion of the multi-layer film structure to expose the first end region of the first portion and the first end region of the second portion; and forming a fifth electrode coupled to the exposed first end region of the first portion and the exposed first end region of the second portion, the fifth electrode being insulated from the conductive material layer in the multi-layer film structure;

wherein, the carbon nanotube is supported on the substrate by the plurality of first electrodes, the plurality of second electrodes, the third electrode, the fourth electrode, and the fifth electrode support.

2. The method of claim 1, wherein forming the third and the fourth electrodes comprises:

removing by selective etching multi-layer film structures at the second end regions of the first portion and the second portion, and the two support structures;

using an evaporation and lift-off process to form the third electrode surrounding the second region of the first portion, and heavily dope the second end region of the first portion with impurities of the first conductivity type; and using an evaporation and lift-off process to form the fourth electrode surrounding the second region of the second portion, and heavily dope the second end region of the second portion with impurities of the second conductivity type.

3. The method of claim 1, wherein the third electrode and the fourth electrode are formed using different materials.

4. The method of claim 1, wherein forming the fifth electrode comprises:

using an etch back process to partially remove the multi-layer film structure at the intersection of the first end regions of the first and second portions to expose the first end region of the first portion and the first end region of the second portion;

oxidizing a surface region of the conductive material layer to form an oxide layer; and using an evaporation and lift-off process to form the fifth electrode, the fifth electrode being insulated from the multi-layer film structure by the oxide layer.

5. The method of claim 1, wherein forming a multi-layer film structure surrounding the carbon nanotube comprises forming a multi-layer film structure overlying the insulating layer overlying the substrate and the two support structures.

6. The method of claim 1, wherein the first dielectric layer and the second dielectric layer in the multi-layer film structure comprise a high K dielectric.

7. The method of claim 1, wherein the conductive material layer in the multi-layer film structure comprises a polysilicon material or a metal material.

8. The method of claim 1, wherein:

the conductive material layer thickness is in the range of 2-10 nm;

the first dielectric layer thickness is in the range of 1-3 nm;

the thickness range of the second dielectric layer is in the range of 1-3 nm;

the length of the carbon nanotube is 50-1000 nm;

adjacent first electrodes are spaced from each other by a distance of 10-50 nm; and an adjacent plurality of second electrodes are spaced from each other a distance of 10-50 nm.

9. The method of claim 1, wherein providing the substrate structure comprises:

providing a substrate;

forming an insulating layer overlying the substrate;

forming a layer of porous silicon on the insulating layer;

introducing a metal catalyst in a surface region of the porous silicon layer for forming the carbon nanotube;

causing the metal catalyst to react with a carbon-based compound to form the carbon nanotube on the surface of the porous silicon layer;

doping the carbon nanotube to form the first portion and the second portion; and removing the porous silicon layer under the carbon nanotube to form two support structures with the remaining porous silicon layer.

10. The method of claim 9, further comprising:

forming a photoresist layer on the surface of the porous silicon;

patterning the photoresist to remove the photoresist from the desired area for the carbon nanotube;

injecting a solution of the metal catalyst into the desired area of the carbon nanotube;

performing heat treatment of the solution of metal catalyst in an atmosphere of reducing gas to form metal nanoparticles; and removing the remaining photoresist on the surface of the porous silicon.

11. The method of claim 9, wherein forming a layer of porous silicon on the insulating layer comprises:

forming heavily doped polysilicon on the insulating layer;

using corrosion or etching to form the porous silicon.

12. The method of claim 9, wherein the carbon-based compound comprises one or more of methane, ethylene, acetylene, carbon monoxide, and benzene.

13. The method of claim 9, wherein the metal catalyst comprises one or more of platinum, gold, silver, copper, and nickel.

14. A semiconductor device, comprising:

a substrate and an insulating layer overlying the substrate;

a carbon nanotube located above the insulating layer, the carbon nanotube comprising a first portion and a second portion, said first and second portions, respectively, comprising a first end region, a channel region, and a second end region; wherein said first end region of the first portion is connected to the first end region of said second portion, said first portion and said second portion having different conductivity types;

a multi-layer film structure surrounding the channel region and the first end region of the first portion and the channel region and the first end region of the second portion, the multi-layer film structure including a first dielectric layer, a conductive material layer, and a second dielectric layer; wherein the multi-layer film structure is partially removed to expose the first end region of the first portion and the first end region of the second portion;

a plurality of first electrodes surrounding the multi-layer film structure at the channel region of the first portion, the plurality of first electrodes being separated from each other;

a plurality of second electrodes surrounding the multi-layer film structure at the channel region of the second portion, the plurality of second electrodes being separated from each other;

a third electrode surrounding the second region of the first portion;

a fourth electrode surrounding the second region of the second portion; and a fifth electrode coupled to the exposed first end region of the first portion and the exposed first end region of the second portion, the fifth electrode being insulated from the conductive material layer in the multi-layer film structure;

wherein, the carbon nanotube is supported on the substrate by the plurality of first electrodes, the plurality of second electrodes, the third electrode, the fourth electrode, and the fifth electrode.

15. The device of claim 14, wherein:

the second end region of the first portion is more heavily doped than the first end region and the channel region of the first portion; and the second end region of the second portion is more heavily doped than the first end region and the channel region of the second portion.

16. The device of claim 14, wherein a portion of the multi-layer film structure is disposed between the electrodes and the insulating layer overlying the substrate.

17. The device of claim 14, wherein:

each of the first dielectric layer and the second dielectric layer in the multi-layer film structure comprises a high K dielectric; and the conductive material layer in the multi-layer film structure comprises a polysilicon material or a metal material.

18. The device of claim 14, wherein:

the conductive material layer thickness is in the range of 2-10 nm;

the first dielectric layer thickness is in the range of 1-3 nm;

the thickness range of the second dielectric layer is in the range of 1-3 nm;

the length of the carbon nanotube is 50-1000 nm;

adjacent first electrodes are spaced from each other by a distance of 10-50 nm; and an adjacent plurality of second electrodes are spaced from each other a distance of 10-50 nm.

19. The device of claim 14, wherein the carbon nanotube is formed by a reaction of a metal catalyst with a carbon-based compound.

20. The device of claim 19, wherein:

the metal catalyst comprises one or more of platinum, gold, silver, copper, and nickel; and the conductive material layer in the multi-layer film structure comprises a polysilicon material or a metal material.

* * * * *